United States Patent
Leitgeb et al.

(10) Patent No.: US 10,420,206 B2
(45) Date of Patent: Sep. 17, 2019

(54) COMPONENT CARRIER COMPRISING A DEFORMATION COUNTERACTING STRUCTURE

(71) Applicant: AT & S Austria Technologie & Systemtechnik Aktiengesellschaft, Leoben (AT)

(72) Inventors: Markus Leitgeb, Trofaiach (AT); Urs Hunziker, Meilen (CH)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/558,051

(22) PCT Filed: Mar. 11, 2016

(86) PCT No.: PCT/EP2016/055279
§ 371 (c)(1),
(2) Date: Sep. 13, 2017

(87) PCT Pub. No.: WO2016/146522
PCT Pub. Date: Sep. 22, 2016

(65) Prior Publication Data
US 2018/0070443 A1    Mar. 8, 2018

(30) Foreign Application Priority Data
Mar. 13, 2015    (DE) .......................... 10 2015 103 724

(51) Int. Cl.
*H05K 1/11* (2006.01)
*H05K 1/02* (2006.01)
(Continued)

(52) U.S. Cl.
CPC ........... *H05K 1/0271* (2013.01); *H05K 1/115* (2013.01); *H05K 1/185* (2013.01); *H05K 3/42* (2013.01);
(Continued)

(58) Field of Classification Search
CPC ................... H05K 1/03; H05K 1/11
(Continued)

(56) References Cited

U.S. PATENT DOCUMENTS 7,284,323 B2    10/2007    Cheng
7,786,390 B2    8/2010     Ikeda
(Continued)

FOREIGN PATENT DOCUMENTS

CN    101352109 A    1/2009
CN    101510538 A    8/2009
(Continued)

OTHER PUBLICATIONS

China National Intellectual Property Administration, First Notification of Office Action, dated Apr. 24, 2019, Application No. 201680027516.2, (English Translation), pp. 1-3.
(Continued)

*Primary Examiner* — Chau N Nguyen
(74) *Attorney, Agent, or Firm* — Robert A. Blaha; Smith Tempel Blaha LLC (57) ABSTRACT

Disclosed is a device for electrically connecting components, which device has at least one electrically insulating layer structure, at least one electrically conducting layer structure, which is stacked and consolidated with the at least one electrically insulating layer structure under formation of a stack of layers, and a warpage stabilization structure for stabilizing the device in a warpage-suppressing manner, which structure at least partially pervades layer structures of the stack of layers.

18 Claims, 4 Drawing Sheets

(51) Int. Cl.
*H05K 1/18* (2006.01)
*H05K 3/42* (2006.01)

(52) U.S. Cl.
CPC .......................... *H05K 2201/068* (2013.01); *H05K 2201/096* (2013.01); *H05K 2201/09136* (2013.01); *H05K 2201/09827* (2013.01); *H05K 2201/09836* (2013.01); *H05K 2201/09845* (2013.01); *H05K 2203/0207* (2013.01); *H05K 2203/1572* (2013.01)

(58) Field of Classification Search
USPC .................................................. 174/262, 266
See application file for complete search history.

(56) References Cited

U.S. PATENT DOCUMENTS

| | | | |
|---|---|---|---|
| 8,101,865 B2 | 1/2012 | Ikeda | |
| 8,324,506 B2 | 12/2012 | Ikeda | |
| 2003/0137056 A1* | 7/2003 | Taniguchi | H01L 23/481 |
| | | | 257/774 |
| 2006/0108680 A1 | 5/2006 | Wu et al. | |
| 2009/0194322 A1 | 8/2009 | Usui et al. | |
| 2010/0089632 A1 | 4/2010 | Ikeda | |
| 2010/0307809 A1 | 12/2010 | Noda et al. | |
| 2012/0156482 A1* | 6/2012 | Hisano | B29C 41/24 |
| | | | 428/343 |
| 2012/0186868 A1* | 7/2012 | Noda | H05K 1/115 |
| | | | 174/262 |
| 2014/0254121 A1* | 9/2014 | Jung | H05K 1/0271 |
| | | | 361/774 |

FOREIGN PATENT DOCUMENTS

| | | |
|---|---|---|
| CN | 101925266 A | 12/2010 |
| DE | 92 12 750 U1 | 12/1992 |
| JP | H02-60188 A | 2/1990 |
| JP | 2009054761 A | 3/2009 |

OTHER PUBLICATIONS

China National Intellectual Property Administration, First Notification of Office Action, dated Apr. 24, 2019, Application No. 201680027516.2, pp. 1-10.

* cited by examiner

Fig. 17 ial patent application PCT/EP2016/055279 filed
COMPONENT CARRIER COMPRISING A DEFORMATION COUNTERACTING STRUCTURE

CROSS-REFERENCE TO RELATED APPLICATIONS

This application is a US national phase application of international patent application PCT/EP2016/055279 filed on Mar. 11, 2016, which claims the benefit of the filing date of German Patent Application No. 10 2015 103 724.6, filed on Mar. 13, 2015, the disclosures of which are hereby incorporated herein by reference in their entirety.

TECHNICAL FIELD

The invention relates to a device for electrically connecting components, and a method for fabricating a device for electrically connecting components.

TECHNOLOGICAL BACKGROUND

In the conductor board (or printed circuit board) industry, the following directions of development can be recognized: Different methods for embedding (passive and active) components within a conductor board are known. This technology is commonly referred to as embedding. Due to the increasing miniaturization, the connections between the components become ever smaller and finer. The layer thicknesses of conductor boards become ever smaller. The mounting of chips poses ever higher requirements to the conductor board in respect of compatible values of the coefficient of thermal expansion (CTE), ever higher resolution and increasing precisions. In result, a debonding of partly-elastic FR4 materials by glasses and other stiff materials is effected. All these trends lead to an undesired warpage (or deformation, or distortion).

SUMMARY

There may be a need to provide a device for electrically connecting components, which is protected from a damage even when being subjected to changing temperature influences.

This need may be satisfied by the objects having the features according to the independent patent claims. Further embodiment examples are shown in the dependent claims.

According to an embodiment example of the present invention, there is provided a device for electrically connecting components (which may in particular be mounted to the device and/or be embedded in the device, wherein such components may be (for example encapsulated and/or encased, or naked and/or unencased) semiconductor chips, connectors, etc.), which device has at least one electrically insulating layer structure, at least one electrically conducting layer structure, which is stacked and consolidated (in particular grouted) with the at least one electrically insulating layer structure under formation of a stack of layers, and a warpage stabilization structure for stabilizing the device in a warpage-suppressing manner, which at least partially pervades at least a portion of the layer structures of the stack of layers.

According to a further embodiment example of the present invention, there is provided a method for fabricating devices for electrically connecting components, wherein in the method, at least one electrically conducting layer structure is stacked and consolidated (in particular grouted) with at least one electrically insulating layers under formation of a stack of layers, and a warpage stabilization structure for stabilizing the device in a warpage-suppressing manner, which structures at least partially pervades at least two layer structures of the stack of layers, is formed.

In the context of the present application, a "layer structure" may be understood to be a plane or two-dimensional arrangement of one or more continuous or structured layers, which may be formed, for example, from films, thin sheets, platelets, or deposited or applied material. The structuring of such a layer or layer structure can be effected, for example, such that, as a result of the structuring, plural islands may be formed, which may be separated from each other, or however, a contiguous (or continuous) structure. The individual layers and/or layer structures may be connected, for example laminated, to a unitary body, by consolidating (in particular grouting and/or agglutinating, where necessary with addition of heat).

In the context of this application, a "warpage stabilization structure" may be understood to be in particular a bodily (or physical) structure, which may completely or partially pervade plural ones of the layer structure, and which may be configured to counteract a warpage (or deformation, or distortion) of the device (in particular in the presence of thermomechanical tensions). Thereby, a warpage may be understood to be in particular a deflection (or distortion), which changes an outer shape of the device with respect to a plane or two-dimensional arrangement. Demonstratively, the warpage stabilization structure may counter a tendency of warpage of a device with a counterforce, which may impede this warpage, in particular by providing an internal mechanical pre-load (or pre-stress) of the device, such that the warpage tension and the countertension may compensate completely or partially. Such warpages may be generated, for example, under an influence of temperature, if different components of the device (in particular the materials of the electrically insulating layer structure(s) and those of the electrically conducting layer structure(s)) have different values of the coefficient of thermal expansion, which may lead to the formation of inner tensions in the device under a temperature change. The warpage stabilization structure may be configured to counteract such internal tensions. However, the active principle (or method of action) of the warpage stabilization structure may also be formed such that the warpage stabilization structure evokes (or induces) a stiffening (or reinforcement) at and/or in the device, under the influence of which stiffening the formation of the warpage may not even be effected.

According to an exemplary embodiment of the invention, by an integration of one or plural warpage stabilization structures in a device, the tendency thereof for forming warpages, in particular under a temperature change, can be counteracted efficiently. This can be effected in that the warpage stabilization structure generates, in the interior of the device, a counterforce which impedes the warpage tendencies. Particularly advantageously, warpage stabilization structures may also be used synergistically as functional components of the device, for example by a implementing the same as specially configurable, electrically conducting through-crossing connections, which may then also serve for electrically coupling mutually opposite main surfaces of the device (with electronic components, for example electronic chips, mounted thereto, if applicable).

In the following, additional exemplary embodiments of the device and the method are described.

According to an exemplary embodiment, the warpage stabilization structure may be formed by at least one through-crossing connection, in particular by a plurality of, through-crossing connections, the main extension direction of which may form an acute angle with at least one main surface of the device. In the context of the present application, the expression "main extension direction" may be understood to be an effective direction, along which the through-crossing connection extends relatively to the device. The main extension direction may result in particular by a straight-lined (or rectilinear) connection line between two opposite centers of areas of access openings of the through-crossing connection at the two opposite ends of the through-crossing connection (in particular at the two opposite main surfaces of the device, if an associated through-crossing connection is formed as a through boring, which is filled with material at least partially). Such through-crossing connections may serve, beside the function as a warpage stabilization structure, to effect an electrically conductive coupling between two different regions of the device. For example, an electrically conducting coupling between opposite main surfaces of the device may be effected by the through-crossing connection(s), for example in order to electrically conductingly couple electronic chips or other electronic components, which may be mounted there, with each other. It may also be possible that a through-crossing connection effects an electrical coupling between such a main surface and an electronic component, which may be embedded in the interior of the device, such that the through-crossing connection may then be formed not as a through boring, but instead as a blind drill hole which may be filled electrically conductingly.

However, through-crossing connections, which may be oriented perpendicular to the main surfaces of the plate-like device, which may have in particular been used conventionally, and which may have a constant radius (i.e. circular cylindrical vias having a constant radius, which may extend along a stacking direction of the layer structures), may not have proven to be suitable to unfold a warpage-suppressing effect due to their high degree of symmetry. Demonstratively, this may be explained by the fact that it is just mechanical tensionings (or warpings) due to through-crossing connections, which may be arranged acute-angled with respect to the main surfaces of the device, and which may be preferably formed asymmetrically, that may counteract effectively to the warping tendency. It may be important for the warping-stabilizing effect of such oblique through-crossing connections, that they draw, with the main surfaces of the device, an angle which may be different from 0° and/or 90°, because just thereby, a warping-suppressing loss of symmetry may occur, which may generate, in an advantageous manner, tensions in the interior of the device, which tensions may prevent an undesired warping of the device under an influence of temperature.

According to an exemplary embodiment, the acute angle may be in a range between 70° and 89°, in particular in a range between 80° and 88°. It appeared that in particular relatively small deviations of the main extension direction of the through-crossing connections with respect to a surface normal of the main surfaces of the plate-shaped device may result in a particularly effective suppression of warpings. If the angles become too small, on the one hand the expenditure in terms of material and area of the warpage stabilization structure may become too large, and on the other hand the inclination with respect to the suppression of the warping may reduce. On the contrary, if the angle becomes too large, the through-crossing connection may approach a conventional vertical orientation, which may not suppress the warping, too much. In particular, an angular range between 80° and 88° may have turned out to be particularly advantageous for the suppression of warping tendencies.

According to an exemplary embodiment, at least a portion of different ones of the plurality of through-crossing connections may be arranged with different values of the acute angle with respect to the at least one main surface, and may thus not be parallel to each other, preferably skew-whiff to each other. According to this embodiment, which has resulted in a particularly effective suppression of warping, not only the through-crossing connections may be inclined relatively to the main surface of the device, but also the main extension directions of different through-crossing connections may be inclined relative to each other. Due to this further desired loss of symmetry, which may counteract the conventional tendencies for a formation of an arrangement of through-crossing connections as asymmetrical as possible, the orderliness (or regularity) in the device may be lost still further, which may further reduce the tendency of the device for the formation of warpages in a surprising manner.

According to an exemplary embodiment, at least a portion of the at least one through-crossing connection may be filled at least partially with an electrically conducting material, in particular copper. If the through-crossing connections are filled with an electrically conducting material, such as copper, they may, beside their warping-suppressing function, also realize an electrically conducting function. In the case of a use of copper, which may be the common electrically conducting material for contactings of devices, it may advantageously be unnecessary to introduce a further material into the process, which may result in a device that can be formed cost-effectively. Adhesion problems and electrically conducting contact problems at borders between too many different materials may thus be avoided. In addition, the use of copper for filling the through-crossing connections may result in that no warpings caused by temperature may have to be feared between the through-crossing connections and the electrically conducting layer structures (which are preferably also formed of copper).

According to an exemplary embodiment, the electrically conducting material of the at least one through-crossing connection may adjoin directly to the at least one electrically insulating layer structure at least along a portion of the extension of the at least one through-crossing connection through the device. By the through-crossing connections having an inclined orientation adjoining to the electrically insulating material at least along a portion of their extension in the interior of the device, an effective keying (or wedging) and/or warping between the electrically conducting material of the through-crossing connection and the electrically insulating material of the at least one electrically insulating layer structure may be effected. This may further reduce the tendency for forming warpage.

According to an exemplary embodiment, at least a portion of the at least one through-crossing connection may be free of material. According to this alternative embodiment, the through-crossing connections may remain free of material also totally or partially, thus may be formed as hollow or only partially filled blind drill holes or through-holes, and may still develop a warpage-suppressing effect. Such partially or completely unfilled through-crossing connections may serve in a synergistic manner as mounting structures for mechanically mounting (for example inserting (or plugging)) components on the device, or the device to an electronic peripheral device.

According to an exemplary embodiment, the at least one through-crossing connection may be formed by one single, in particular filled with material, angled drill hole (or slant drill hole), wherein the inclination may be related to the mutually parallel main surfaces of the device. One single (for example substantially circular cylindrical) angled drill hole, which may be generated by a mechanical drill or a laser beam which acts from one side of the device, can be processed in a particularly simple manner, and may lead to good results in terms of warpage suppression. For this purpose, the orientation of the laser and/or of the mechanical drill with respect to a normal direction of the main surfaces of the device may have to be inclined. Alternatively, the center of the drill hole may deviate from the center of the device to the upper side or to the bottom side. In particular, the hole may be formed inclined and/or acute-angled with respect to a main surface of the device. It may also be possible to implement a center of the hole asymmetrically in the thickness direction of the device, wherein such a center may be defined in particular by a border between two partial drill holes, which may be formed for a joint formation of the hole, starting from opposing main surfaces of the device in the device.

According to an exemplary embodiment, the at least one through-crossing connection may be formed by at least two drill holes (in particular blind drill holes), which may be connected with each other and which may be formed asymmetrically to each other (in particular laterally offset to each other and/or inclined relative to each other). According to this particularly preferred embodiment, which may result in an excellent suppression of warpage tendencies, the asymmetry of the respective through-crossing connection may be increased by generating the through-crossing connection from two partial drill holes, which may extend from mutually opposing main surfaces of the device, and which may be brought in connection with each other. Stated differently, partial areas at the ends of the two mutually opposing drill holes may overlap with each other straightly and/or only partially, in order to thereby establish a step-like transition region in particular in the border zone, at which the symmetry may be particularly low. This may be effected, for example, by a corresponding offset of a laser or a mechanical drill, which may act at two opposing main surfaces (preferably one after another, but optionally also simultaneously). Thereby, there may be effected, for example, a formation of two circular cylindrical drill holes, which may be laterally displaced to each other, and which may have an overlapping zone, or a sand glass (or hour glass) geometry due to two laterally offset conical drill holes, which may be brought in connection with each other. It may also be possible, alternatively or in addition to a lateral offset of the two partial drill holes, to allow for them different diameters, different cross-sectional shapes and/or different penetration depths into the device (which can be adjusted for example by differently lasting drilling times and/or laser powers upon forming the partial drill holes, which may be formed starting from the main surfaces of the device), in order to possibly cause an asymmetry.

A drill hole may also be stepped (or graded), if applicable. For example, one drill hole having a larger diameter may be formed less deep, and another drill hole having a smaller diameter may be formed deeper. Embodiment examples having a multiple of this, i.e. the stepped formation of at least three partial drill holes having different diameters, may also be possible. The partial drill holes may be formed selectively from one side or from both sides and/or main surfaces of the device.

According to an exemplary embodiment, the drill holes, which may be laterally offset to each other, may be oriented perpendicular to at least one main surface of the device. According to this embodiment, it may not be the inclined orientation of the partial drill holes itself, but the lateral displacement thereof, which may result in a main extension direction, which may deviate from the normal to the main surface of the device.

According to an exemplary embodiment, the drill holes, which may be laterally offset to each other, may each have a substantially circular cylindrical shape. Such a circular cylindrical shape may be effected, for example, by a mechanical drill.

According to an exemplary embodiment, the drill holes, which may be laterally offset to each other, may each have substantially a conical or frustoconical shape. Such a geometry may be effected, for example, by a laser drill, which may generally generate a cross-sectional area of a partial drill hole that may be larger at an outer side of the device than in the interior thereof.

According to an exemplary embodiment, the drill holes, which may extend starting from the two opposing main surfaces of the device, may have a lateral offset to each other in a range between 3 µm and 50 µm, if the device is formed as a conductor board and/or a printed circuit board (PCB). According to another exemplary embodiment example, the drill holes, which may extend starting from the two opposite main surfaces of the device, may have a lateral offset to each other in a range between 0.5 µm and 3 µm (in particular between 0.5 µm and 2 µm), if the device is formed as a substrate (in particular because a substrate as a whole has a smaller dimension than a conductor board). If the lateral offset is too small, the warpage-suppressing effect may become too small and/or may vanish completely. If the lateral offset becomes too large, then the mechanical stability of the warpage stabilization structure itself may suffer from this circumstance, because the overlap may become too small and may lead to a pinch-off (or constriction) of the partial components of the warpage stabilization structure. The mentioned range may have proven to be a particularly advantageous range in connection with the above two requirements.

According to an exemplary embodiment, the at least one through-crossing connection may be integrated in the at least one electrically conducting layer structure and/or in the at least one electrically insulating layer structure with a mechanical pre-load, which may counteract a warpage force that is intrinsic to the component carrier plate. According to this particularly preferred embodiment example, a mechanical pre-load may be inoculated in the device by the manufacturing process of the through-crossing connection itself, which pre-load may then have to be surmounted by a warpage-inducing force, before warpages may occur. In particular, thermomechanical effects during the manufacturing of the device, which may be constructed from heterogeneous materials, may result in the formation of conventionally undesired, but according to embodiment examples of the invention highly desired, inner tensions of the device during a subsequent cooling-down process, and may thus be made utilizable. In other words, it has been recognized with embodiment examples of the present invention, that the conventional prejudice, according to which interior mechanical tensions of the device would necessarily lead to a loss of quality or even functionality, may be unfounded in this generality. Rather, such tensions may just contribute to a suppression of undesired warpages.

According to an exemplary embodiment, at least a portion of the at least one through-crossing connection may be formed as a through-contacting, which may pervade the device completely, or as a contacting, which may pervade the device only precisely partially. Thus, according to one implementation, the through-crossing connection may be formed as a via, which may electrically conductively couple the two main surfaces of the device with each other. Alternatively, also an only partially filled and/or blind hole type element may be realized as a through-crossing connection, for example in order to contact electronic components which may be embedded in the interior of the device.

According to an exemplary embodiment, a number of through-crossing connections per area of a main surface of the device may, if the latter is formed as a conductor board, be in a range between 50 $mm^{-2}$ (i.e. a number of 50 through-crossing connections per square millimeter of the main surface of the conductor board) and 1000 $mm^{-2}$, in particular in a range between 200 $mm^{-2}$ and 500 $mm^{-2}$. According to another exemplary embodiment, the number of through-crossing connections per area of a main surface of the device may, if the latter is formed as a substrate, be in a range between 4000 $mm^{-2}$ (i.e. a number of 4000 through-crossing connections per square millimeter of the main surface of the substrate) and 8000 $mm^{-2}$. It may have resulted from the described areal densities of the number of through-crossing connections of conductor boards and/or substrates that the stabilization of warpages may work particularly well in those areas. If the areal density of the asymmetrical through-crossing connections or other warpage stabilization structures becomes too small, the desired effect may vanish or may be negligibly small. By contrast, if the number of the through-crossing connections per area becomes too large, this may result, on the one hand, in a great areal expenditure and the risk of forming parasitic electrically conducting channels, and, on the other hand, a self-tension in the interior of the device caused by the through-crossing connections, which then would be excessive, may result in a deterioration of the warpage suppression tendencies.

According to an exemplary embodiment, a, in particular mean, distance between neighboring through-contactings at a main surface of the device may, if the latter is formed as a conductor board, be in a range between 30 µm and 200 µm, in particular in a range between 50 µm and 90 µm. On the contrary, if the device is formed as a substrate, then the distance may be in a range between 1 µm and 30 µm, in particular in a range between 5 µm and 20 µm. If the distance of neighboring through-crossing connections (pitch) having an inclined main extension direction becomes too small, then the zones of electrically insulating material between the inclined through-crossing connections may become too small, such that they may lose mechanical stiffness and may no longer withstand the self-tension which may be formed in the interior of the device. Crack formation or other undesired effects may then be effected. On the contrary, if a distance between neighboring through-contactings becomes too large, the warpage-stabilizing effect may be lost up to a degree that can, in the end, no longer be accepted.

According to an exemplary embodiment, the through-crossing connections may be formed by mechanical drilling or by laser drilling. However, other methods for generating through-crossing connections may also be possible, such as for example a chemical etching (optionally in combination with lithography).

According to an exemplary embodiment, the through-crossing connections may be formed by drilling, starting from the two opposite main surfaces of the device. Thus, an adjustable offset when drilling from opposite sides may enable to precisely adjust the desired asymmetry between different sections of through-crossing connections.

According to an exemplary embodiment, the at least one through-crossing connection may, during the fabrication of the at least one through-crossing connection in the at least one electrically conducting structure and/or in the at least one electrically insulating layers, be integrated in the surrounding material of the device with a mechanical pre-load (or pre-tension), which may counteract a warpage force. Thus, the warpage-suppressing effect of the warpage stabilization structure can be established in the device already during the fabrication process thereof, by intentionally implementing mechanical warpages in the device. The resulting internal forces of the device, which may demonstratively lead to a keying (or wedging) of the constituents thereof, thus may counteract a warping tendency which may come along with thermal expansion.

According to an exemplary embodiment, the mechanical pre-load may be generated by adjusting a temperature for forming the at least one through-crossing connection higher than a temperature for the processing of the at least one electrically insulating layers and/or of the at least one electrically conducting layer structure. During the process of heating up and/or cooling down for forming the material-filled through-crossing connection, the inoculation of the described pre-load into the device may thereby be effected, and a reduced tendency to form warpages may thereby also be effected during operation. Such a mechanical pre-load may be generated also by a mechanical stress, which may be applied to the warpage stabilization structure, in particular during the incorporating into the device.

According to an exemplary embodiment, a material of the at least one electrically insulating layer structure may be selected with a smaller value of the coefficient of thermal expansion than at least one of the group, which may consist of: a material of the at least one electrically conducting layer structure and a material of the at least one through-crossing connection. For this configuration of the values of the coefficient of thermal expansion, the generation of self-tensions in the device may be particularly pronounced by the temperature-intensive formation of the through-crossing connection.

According to an exemplary embodiment, the mechanical pre-load may be generated by adjusting a temperature for forming the at least one through-crossing connection lower than a temperature for processing the at least one electrically insulating layer structure and/or the at least one electrically conducting layer structure. According to this embodiment, a high-temperature-based processing of the layer structures in comparison to a formation of the through-crossing connections that may be mild in temperature, may cause the mechanical self-tensions of the device.

According to an exemplary embodiment, a material of the at least one electrically insulating layer structure may be selected with a greater value of the coefficient of thermal expansion than at least one of the group, which may consist of: a material of the at least one electrically conducting layer structure and a material of the at least one through-crossing connection. The implementation described hereinbefore may be pronounced particularly strongly for the mentioned configuration of values of the coefficient of thermal expansion.

According to an exemplary embodiment, the mechanical pre-load may be generated by subjecting the device to a temporary increase of temperature after the forming of the at least one through-crossing connection and after the processing of the at least one electrically insulating layer structure and/or the at least one electrically conducting layer structure, whereby an adaptation of the materials of the device with each other and a build-up of a mechanical bracketing (or clamping) tension may be effected (as a particular implementation of the mechanical pre-load). By tampering the device after its finalization, self-tensions may be generated, and at the same time an equilibration of possibly remaining hollow spaces in the interior of the device due to a flow of material (for example resin of the at least one electrically insulating layer structure) may further suppress the warpage tendencies.

According to an exemplary embodiment, the at least one electrically insulating layer structure may be selected from a group, which consists of: resin (in particular bismaleimide triazine resin), glass fibers, prepreg material, polyimide, a liquid crystal polymer, epoxide-based build-up films, and FR4 material. Resin material may serve as a mechanically stable matrix, which at the same time renders electrically insulating properties to the respective structure. The provision of glass fibers may mechanically strengthen the electrically insulating material, and may in addition cause a desired spatial anisotropy of the mechanical properties. Prepreg material may be a pre-form of FR4 material, and may comprise a mixture of resin and glass fibers. By the use of according prepreg films having openings (or clearances, or recesses), a basis may be established for electronic components to be incorporated in the openings (or are grouted directly in the material), and after grouting the thus obtained structure with further prepreg films, the electronic components may be completely embedded in the electrically insulating material. FR4 (flame resistant) may refer to an established material for devices, which may enable a high mechanical robustness at low cost for a device according to an embodiment example of the invention. The at least one electrically insulating layer structure may also have glass or consist thereof. A ceramic and/or a metal oxide may be possible as further materials for the at least one electrically insulating layer structure.

According to an exemplary embodiment, the at least one electrically conducting layer structure may have copper or may consist thereof. Alternative materials may comprise aluminum, silver, nickel or other suitable metals.

According to an embodiment example, the device may be formed as a conductor board (printed circuit board, PCB). A conductor board (which may also be referred to as a circuit board or printed circuit board) may be referred to as a carrier for electronic components. A conductor board may serve for the mechanical attachment and the electrical connection. Conductor boards may have electrically insulating material as a carrier structure with conducting connections, i.e. conductor paths and contact structures, adhering thereto. Fiber-reinforced plastics may be possible as an insulating material, in particular having epoxide resin, FR4 and/or prepreg. The conductor paths may be etched from a thin layer of copper.

According to an alternative embodiment example, the device may be formed as a substrate. In this context, a substrate may be understood to be a carrier for electrical connections and/or a component carrier similar to a PCB conductor board, however having a substantially greater density of lateral (conductor paths) and/or vertical (drill holes) connection locations, such as those employed for the fabrication of electrical and mechanical connections of encased or unencased components (in particular an IC chip) and a PCB conductor board. Thus, the term "substrate" may comprise "IC substrates".

According to an embodiment example, in the device, at least one electronic component may be embedded in the at least one electrically insulating layer structure and/or in the at least one electrically conducting layer structure. Such an electronic component and/or such an "electronic element" may, in particular, be each active electronic component (such as for example an electronic chip, in particular a semiconductor chip) or each arbitrary passive electronic component (such as for example a capacitor, a resistor or an inductivity). Examples of embedded elements and/or components may be: a data storage device, such as for example a DRAM (or any other arbitrary storage), a filter device (which may be configured for example as a high pass filter, a low pass filter or a bandpass filter, and which may serve, for example, for filtering frequencies), an integrated circuit (such as for example a logic IC), a signal processing component (such as for example a microprocessor), a power management component, an optical-electrical interface element (for example an opto-electronic component), a voltage converter (such as for example a DC/DC converter or an AC/DC converter), an electromechanical transducer (e.g. a PZT (lead circonate titanate) sensor and/or actor), a transmission and/or receiving unit for electromagnetic waves (e.g. an RFID chip or a transponder), a cryptographic component, a capacitance, an inductance, a switch (for example a transistor-based switch) and a combination of these and other functional electronic components. The component may also have a microelectromechanical system (MEMS), a battery, a camera, or an antenna.

BRIEF DESCRIPTION OF THE DRAWINGS

In the following, exemplary embodiments of the present invention are described with reference to the following drawings.

DETAILED DESCRIPTION OF EXEMPLARY EMBODIMENTS

Same or similar components in different figures are provided with same reference numerals.

Before exemplary embodiments of the invention are described with reference to the figures, some general aspects of the invention shall still be explained.

Conductor boards may experience a certain degree of warping in the framework of their own manufacturing process and/or in the subsequent component placement process. This may be caused by the different values of the coefficient of thermal expansion (CTE values) of the involved materials, by the mechanical wear (or load) and/or by the hardening and drying processes during the processing. In the simplest case, this warping may be a property change of the equipped conductor board in the sense of quality assurance, but may possibly lead to a functional failure of the whole conductor board. Manufacturers of conductor boards have tried for a long time to reduce and to minimize the warpage (or deformation).

It is further known that through-contactings and vias in a conductor board may be fabricated at a right angle (z-axis) with respect to the conductor plate (xy-plane).

It is further known that in the construction industry special constructions and solidity can be reached by reinforced concrete. Therein, tensile stresses may be built up with respect to the pressure resistant carrier construction by embedded systems. It is also known from the construction industry that a pre-load of a cable can be achieved belatedly by embedding tensioning cables in a guiding bushing and by tensioning them belatedly.

By special techniques, it may be possible for a conductor board to fabricate a through-contacting which may not extend precisely perpendicular to the plane of the conductor board. Further, particular forms (or implementations) of through-contactings may be possible, in which the engaging (or charging) forces may correspond substantially to an inclined through-contacting, that is, a force-equivalent system to an inclined through-contacting can be built up also from offsetted perpendicular components of a through-contacting.

It has been found surprisingly that by skilful dimensioning the diameter of the through-contacting (tensioning cable as an analogon to the reinforced concrete) with respect to the surrounding insulation layer (for example FR4, which may correspond to the concrete in the analogon of reinforced concrete), a similar effect can be achieved in the interior of a conductor board. Systems with partial pre-load can also be manufactured as a function of the dimensioning. The mechanical tensions may be dimensioned specifically such that they may counteract a warpage during the manufacture.

It was found further that such tensions can be built up and controlled by basically different mechanisms:

Group A: If the CTE of the insulation (i.e. the electrically insulating layer structures) is smaller than the CTE of the conductor (i.e. the electrically conducting layer structures), such as for example in the combination glass/copper.

1) Because the through-contacting may be effected at a higher temperature than the belated averages of the operational temperature, a basic tension can be built up selectively along a desired trajectory in the conductor board. This may arise because the CTE of copper may be higher than that of the insulation.

2) In the framework of a curing process (or a post-curing process) of the FR4, the layer structures may be heated up to a specific degree. Thereby, the copper with its large CTE may expand relatively strong. In this expanded state, the FR4 material/the prepreg and/or other insulations may adapt to the new mechanical spatial conditions of the expanded copper. The subsequent cooling down of the resin, which may now be cured, may result in a build-up of a bracketing tension (or clamping tension) by the copper, which may contract more than the insulation material during the cooling down.

3) A normally fabricated through-contacting may be heated up during a heating process of the whole conductor board (this heating process may be an after-curing of the basic material during particular process steps, and may also occur in the framework of the proper reflow soldering process). Because the copper may extend stronger than the surrounding insulator due to its larger CTE, a delamination tension may be built up first (i.e. a mechanical tension which tries to pull apart the layers of the conductor board assembly in an essentially vertical direction). By a proper dimensioning of the hole size and the wall thickness of the copper filling (up to a complete filling), a point may be found, where copper may arrive at its limit of elasticity by the keeping-together forces of the insulation layer (in particular very large for glass) and may deform plastically (i.e. is stretched). For copper (and at best minimal alloying additions), this point can be planned between 40 MPa and 300 MPa. The subsequent cooling down may lead to a build-up of a mechanical tension and can be planned such that these forces counteract a warpage.

Group B: If the CTE of the insulation is greater than the CTE of the conductor (for example certain FR4 materials, wherein the CTE in the x/y direction is different than in the z direction)

1) Because the through-contacting may be effected at a lower temperature than the belated averages of the operational temperature or the increased temperatures in the reflow process, a basic tension can be built up along a prescribable line. This may arise because the CTE of copper may be lower than that of FR4 and/or other insulators.

2) By the build-up of a partial pre-load in the framework of the curing process of, for example, FR4 it may also be possible to condition a controlled warpage prior to the reflow soldering. The subsequent reflow process may then result in fewer warpages due the partial pre-load.

3) The drill holes can be placed such that the temperature increase during the reflow process may result in a tension and thus in a controlled stiffening of the conductor board. After the cooling down, the properties of the conductor boards may be as without these stiffenings, i.e. this process may also be suitable for corresponding flexible conductor boards as long as the elasticity of the flexible portion is given only at low temperatures. Insulation materials having a temperature-dependent variable module of elasticity may be applied herein.

One embodiment example may consist in the provision of at least one inclined (or oblique) drill hole. As a variant to this, it may be possible to provide only through-contactings or also filled through-contactings. It may be possible to provide a via, which may end at a main surface of the conductor board, and/or a "buried" via as a warpage stabilization structure. The providing of a warpage stabilization structure can be performed at a point in time, when the embedding has already taken place, is just taking place, or will still take place. An insulator may be a part of a substrate, and herein the material may also be glass. Another embodiment example may relate to plural through-contactings, which may extend along different directions and/or main extension directions. Still another embodiment example may relate to two blind holes (which may be preferably connected with each other in the interior of the conductor board), which may extend into the interior starting from the opposite sides of a conductor board (printed circuit board, PCB). Another embodiment example may provide conical drill holes. Still another embodiment example may relate to frustums (or truncated cones) as the mutually contacting elements, also with different angles of the inclined edges or further asymmetries. A filling of the through-contactings with a material having a particular CTE value may be possible, whereby an even more specific reacting to a temperature change can be achieved (for example aluminium).

For example, in one embodiment example of the method, a drilling of holes in the conductor board may be effected firstly, followed by a depositing of a currentless seed layer of copper (or of another metal that is suitable for this purpose). This may be followed by a filling with electrolysis copper. The latter process can be selected such that a significantly higher temperature is adhered to (for example 80° C.). Copper as a good heat conductor can contract itself differently than the surrounding substrate, and may effect, as a warping stabilization structure, a mechanical tension in the plate, which may act to strengthen, impede warpage stabilize the substrate.

According to an embodiment example, a conductor board can be provided, which may contain at least one through-contacting, which may be oriented at a different angle than 90 degrees to the direction of the conductor board. Alternatively or supplementingly, at least one through-contacting may have an asymmetry with respect to a direct and straight-lined through-contacting.

A size of a borehole can be below 100 μm (in particular below 30 μm). FR4, epoxide resin, Teflon, polyamide, polyimide, cyanate ester and/or bismaleimide triazine resin, for example, may be possible as an electrically insulating base material of the conductor board, alternatively or supplementingly also glasses and glass-type carrier materials (for example multi-layer glass) as well as ceramics or metal oxides. A conductor plate according to an exemplary embodiment may contain at least one embedded component. A conductor plate according to an exemplary embodiment of the invention may have one or more through-contactings, which may result from slightly offset (in particular blind) drill holes from each side of the conductor board. For such a through-contacting, a borehole diameter may vary with the depth of the borehole (in particular in a manner so as to form a sandglass profile in cross-section). A conductor board according to an exemplary embodiment may play the role of a substrate and/or of a chip carrier. Insulation materials of a conductor board according to an exemplary embodiment of the invention may contain resins, glasses, ceramics, or metal oxides. A through-contacting may consist of copper, silver, or similar materials having a high conductance value.

Figure 1:
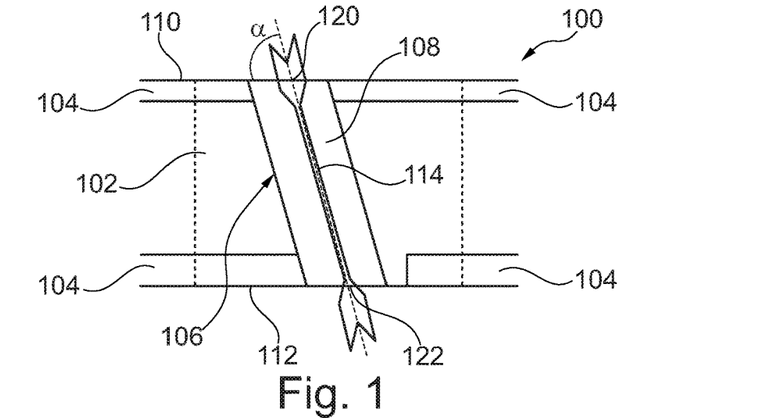
FIG. 1 shows a cross sectional view of a conductor board according to an exemplary embodiment of the invention.

FIG. 1 shows a cross-sectional view of a conductor board 100 (PCB, printed circuit board) according to an exemplary embodiment of the invention.

The conductor board 100 may include an electrically insulating layer structure 102 of FR4 and/or prepreg material, and may be composed of one or more layers or films that are grouted with each other. It may also be possible to provide plural electrically insulating layer structures 102. In addition to this, the conductor board may have electrically conducting layer structures 104, which may be formed as structured copper films, and which may be grouted with the electrically insulating layer structure 102 under formation of a lamination. The stack of layers, which may be composed of the electrically insulating layer structure 102 and the electrically conducting layer structure 104, may be completely pervaded in the stacking direction, which may be vertical according to FIG. 1, by a warpage stabilization structure 106 for warpage-suppressingly stabilizing the conductor board 100.

The warpage stabilization structure 106 may be formed of a plurality of through-crossing connections 108, which may be formed as vias and may be formed extending inclinedly (or obliquely), of which connections only one is shown in FIG. 1 for reasons of clarity. The shown through-crossing connection 108 may extend along a main extension direction 114 and may draw an acute angle α of ca. 80° with the parallel main surfaces 110, 112 of the conductor board 100, which may be opposite to each other. The main extension direction 114 of the through-crossing connections 108, which may extend inclinedly (or obliquely) with respect to the stack of layers, may result from a straight-lined connection between the centers 120, 122 of areas of the exposed end surfaces of the through-crossing connections 108 at the main surfaces 110, 112 of the conductor board 100. Different ones of the through-crossing connections 108 may be arranged with different values of the acute angle α with respect to the main surfaces 110, 112 and may thus be oriented non-parallel to each other or skew-whiff, in order to possibly generate a particularly effective warpage stabilization structure 106. The through-crossing connections 108 may be completely filled with an electrically conducting material, which may be copper in the embodiment example shown. The through-crossing connections 108 may thus be formed as metal-filled inclined drill holes. The electrically conducting material of the through-crossing connections 108 may adjoin material of the electrically insulating layer structure 102 and the electrically conducting layer structure 104.

The through-crossing connections 108 may be integrated in the electrically conducting layer structures 104 and in the electrically insulating layer structure 102 with a mechanical pre-load, which may counteract a warpage force.

According to FIG. 1, the warpage stabilization structure 106, which may be formed as the inclined through-crossing connection 108, may penetrate the planar conductor board 100, in particular the layer structures 102, 104 thereof which may be arranged parallel to each other, inclinedly (or obliquely) and/or under an acute angle α. In comparison with a symmetrical, vertical orientation of a via through a conductor board, according to the described embodiment the symmetry may be reduced and an intrinsic mechanical tension may be implemented in the conductor board 100. Thereby, it may be suppressed under an influence of temperature, that the layer structures 102, 104, which may be formed of different materials, and/or the through-crossing connections 108 themselves, may form self-tensions under generation of a warpage due to their different values of the coefficient of thermal expansion. Instead, the formation of such a warpage tendency may be suppressed by the inclined integration of through-crossing connections 108. In particular, the shown through-crossing connection 108 with its inclined orientation may be usable simultaneously, in order to electrically contact and/or to connect with each other electronic components, which may have to be mounted at the mutually opposing main surfaces 110, 112, and which are not shown in FIG. 1. Thereby, a through-crossing connection 108, which may be embedded in the conductor plate functionality, can be established as a warpage stabilization structure 106 virtually without additional expenditure of hardware.

FIG. 2 to FIG. 9 show structures from the field of construction technology. The considerations made further below have been transferred to the conductor board technology in the context of the present invention, and have been made usable in order to develop exemplary embodiments of the invention.

Figure 2:
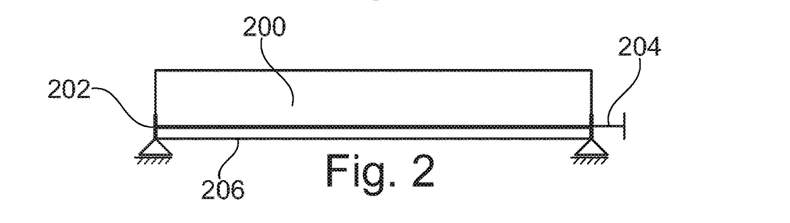
FIG. 2, FIG. 3, FIG. 4, FIG. 5, FIG. 6, FIG. 7, FIG. 8 and FIG. 9 show structures, on the basis of which a formation of a conductor board according to an exemplary embodiment of the invention is derived.
Figure 3:
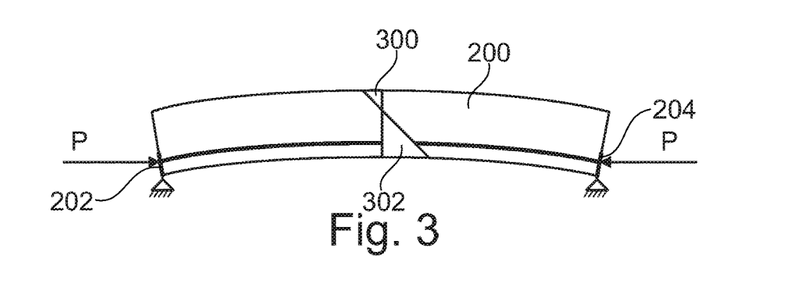
Figure 4:
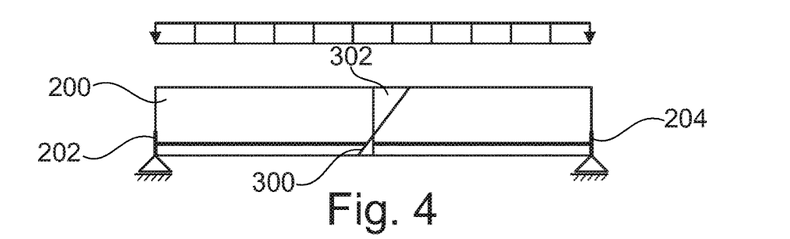
Figure 5:
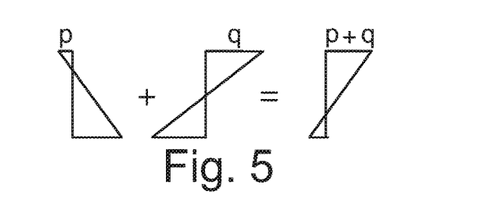

FIG. 2 shows a concrete construction element 200 arranged between a fixed anchor (or tie) 202 and a tensioning anchor 204. A tensioning element 204 is also shown in FIG. 2. FIG. 3 shows the concrete construction element 200 after an application of a pre-load p. A tensile stress $\sigma_t$ (see reference numeral 300) and a compressive stress $\sigma_c$ (see reference numeral 302) may result in a warpage of the concrete construction element 200. FIG. 4 shows the concrete construction element 200 during the applying of an external load q. FIG. 5 represents the superimposition of the concrete tensions during the applying of the pre-load p and the external load q.

In the construction industry, a cable pre-load may also be achieved belatedly by loosely embedding, in concrete, tensioning cables in a guiding bushing, and tensioning them belatedly.

Figure 6:
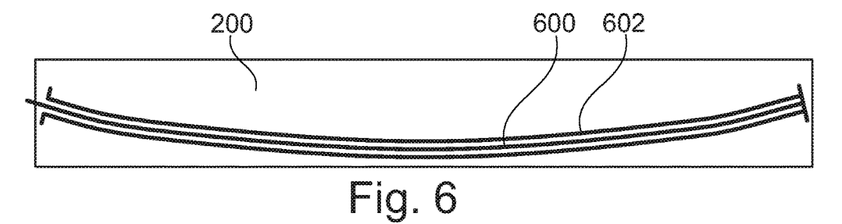
Figure 7:
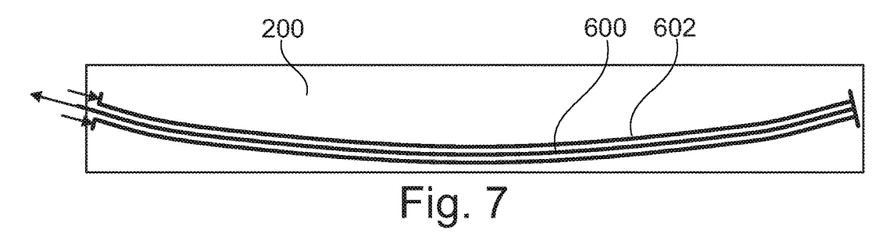
Figure 8:
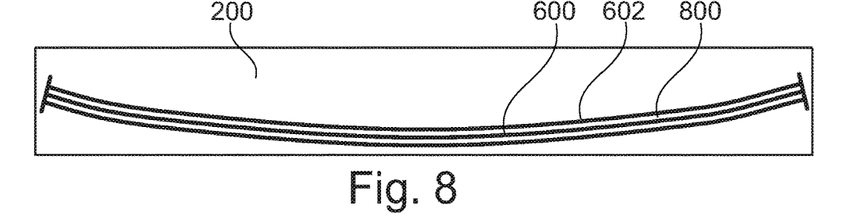
Figure 9:
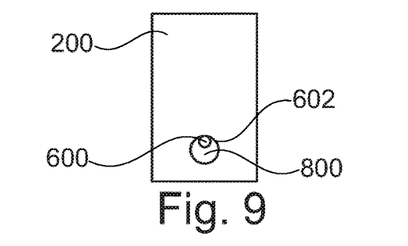

FIG. 6 shows how the tensioning steel (or tensioning cable) 600 may be implemented in a duct (or jacket tube) 602 in a concrete construction element 200. FIG. 7 shows a pre-loading of the tensioning steel 600 against the hardened concrete of the concrete construction element 200. In FIG. 8, the creation of an assembly is shown, if the duct 602 is grouted with cement mortar 800. A corresponding side view is shown in FIG. 9. The specific implementation of a pre-load in a concrete construction element 200 can improve the mechanical rigidity (or stability) thereof.

According to exemplary embodiments of the invention, a through-crossing connection 108 as a warpage stabilization structure 106 may be integrated in a conductor board 100, for example inclinedly (or obliquely) or asymmetrically in another manner, in order to possibly achieve a stability of the structure and a suppression of warping tendencies in the conductor board 100. The implementation of a mechanical pre-load in the conductor board 100 can be achieved particularly effectively by an asymmetrical warping stabilization structure 106.

Figure 10:
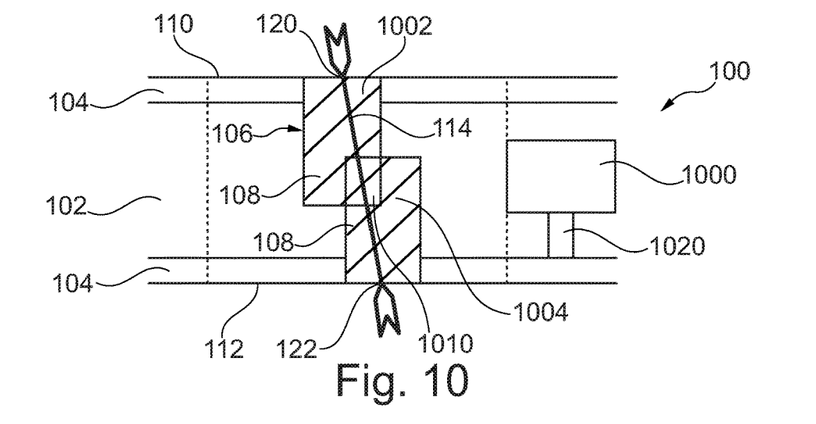
FIG. 10, FIG. 11, FIG. 12, FIG. 13, FIG. 14, FIG. 15 as well as FIG. 17 show cross sectional views of conductor boards according to an exemplary embodiment of the invention.

FIG. 10 shows a cross-sectional view of a conductor board 100 according to an exemplary embodiment of the invention.

According to FIG. 10, through-crossing connections 108 may be formed, respectively, by two partial drill holes 1002, 1004, which may be filled with material, and which may be connected with each other and may be arranged asymmetrical to each other, namely laterally offset to each other in the embodiment example shown. The partial drill holes 1002, 1004, which may be laterally offset to each other, and which may each be formed as a blind hole, may be oriented perpendicular to the main surfaces 110, 112 of the conductor board 100, and may have a circular cylindrical shape. The partial drill holes 1002, 1004 may be formed, for example, by a mechanical drill, which may act in a material-ablating manner from the two main surfaces 110, 112 of the conductor board 100. The partial drill holes 1002, 1004 may have a lateral offset to each other in a range between 3 μm and 50 μm. According to FIG. 10, the through-crossing connection, which in respect of the main extension direction 114 thereof may extend inclinedly with respect to the main surfaces 110, 112, may be realized by two circular cylindrical partial drill holes 1002, 1004, which may have an overlapping zone 1010, and which may have been generated, for example, by a mechanical drill due to an abrasive action on the two mutually opposite main surfaces 110, 112.

An electronic component 1000, for example a semiconductor chip or a block of copper, may be embedded in the electrically insulating layer structure 102, and may be connected electrically conductingly with the electrically conducting layer structure 104 at the main surface 112 of the conductor board 100 by a via 1020. FIG. 10 shows further, that an electronic component 1000 may be embedded in the conductor board 100. When embedding an electronic chip or another electronic component 1000 in a conductor board 100, a further material component (in particular silicon of a semiconductor chip) may be added, which may have totally different properties in respect of the coefficient of thermal expansion than the materials of the layer structures 102, 104 and/or of the through-crossing connection 108. Especially silicon may have a strongly different thermal expansion with respect to the materials copper and FR4, which may be conventionally used in the technology of conductor boards.

Thus, in the configuration shown in FIG. 10 which may have an embedded component 1000, the implementation of a warpage stabilization structure 106 may lead to special advantages and may result in warpage-free conductor boards 100 even for this implementation which may be particularly critical with respect to warpages.

The holes 1002 and 1004 may be, but do not have to be, round holes, but may also have rectangular or rounded rectangular shapes, or may be ovals. In particular for high frequency applications, with regard to a desired propagation of electromagnetic high frequency signals along electrically conducting pathways as undisturbedly as possible to embody the geometrical shape of conductor tracks and vias as similar as possible, it may be advantageous, in particular identically. Because conductor tracks may often have a rectangular or rounded-rectangular cross-section, a corresponding shape of the vias may also be advantageous.

Figure 11:
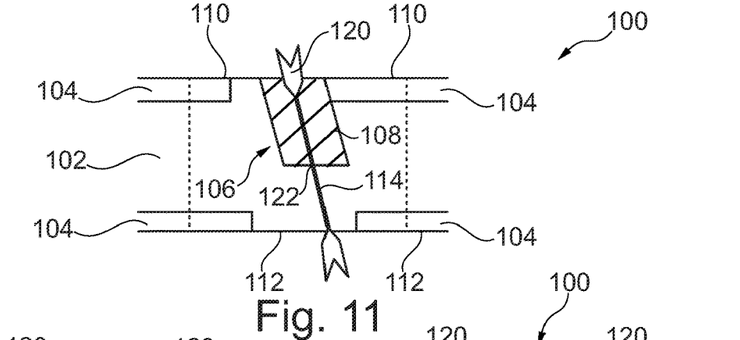

FIG. 11 shows a cross-sectional view of a conductor board 100 according to another exemplary embodiment of the invention. FIG. 11 shows a warpage stabilization structure 106 in the form of a through-crossing connection 108, which may only partially pervade the conductor board 100 and/or the layer structures 102, 104 thereof, and which may thus be formed as a blind hole which is may be filled with material (alternatively free of material), and may extend obliquely (or inclinedly) to the main surfaces 110, 112. The only partial formation of the through-crossing connection 108 without complete pervading of all layer structures 102, 104 of the conductor board 100 may also reduce further the asymmetry of the arrangement, and may thus increase the warpage suppression functionality.

Figure 12:
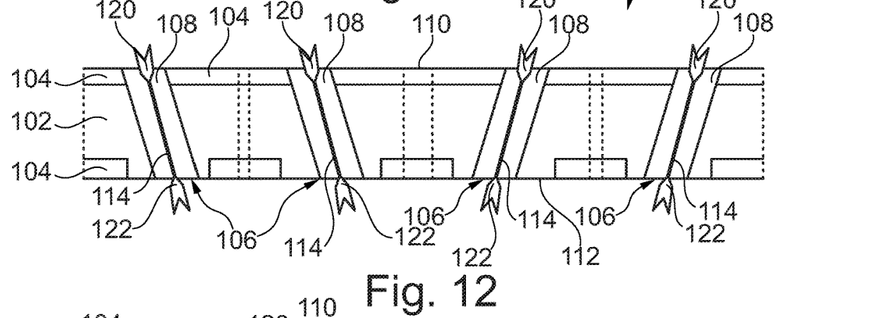

FIG. 12 shows a cross-sectional view of a conductor board 100 according to still another exemplary embodiment of the invention. FIG. 12 shows thus an embodiment of the conductor board 100, in which plural inclined through-crossing connections 108 are shown, which may be (for example, group-wisely) oriented in different main extension directions 114. Thus, the individual through-crossing connections 108 according to FIG. 12 may not be parallel to each other, but may also be arranged with an acute angle to each other. This may further reduce the warpage stabilization, because a warpage-suppressing mechanical pre-load can be implanted in different directions of the conductor board 100 by this asymmetric arrangement.

Figure 13:
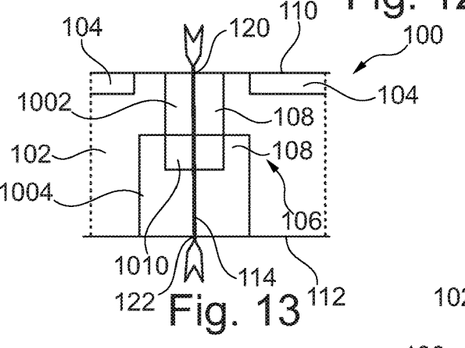

FIG. 13 shows a cross-sectional view of a conductor board 100 according to a further exemplary embodiment of the invention. FIG. 13 shows a through-crossing connection 108, which may again be composed of two partial drill holes 1002, 1004 (see overlapping zone 1010), in which an additional degree of asymmetry may be achieved by providing the partial drill holes 1002, 1004 with different diameters. Also this may improve the warpage-suppressing stabilization. According to FIG. 13, the partial drill holes 1002, 1004 may be formed without lateral offset to each other, thus axially parallel. However, alternatively, a lateral offset between the partial drill holes 1002, 1004 may also be possible, in order to possibly increase the degree of asymmetry and thus the warpage stabilization effect.

Figure 14:
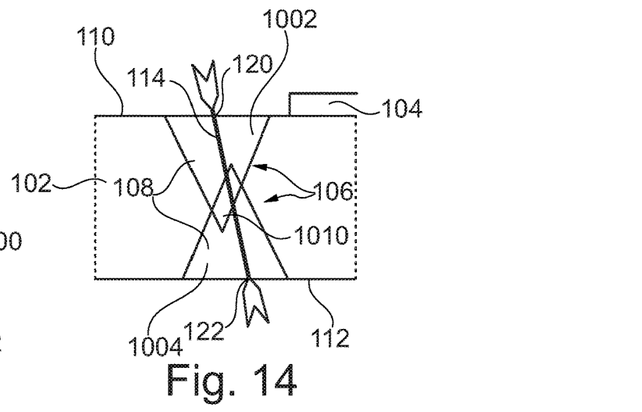

FIG. 14 shows a cross-sectional view of a conductor board 100 according to an exemplary embodiment of the invention, wherein the partial drill holes 1002, 1004 according to FIG. 14, which may be laterally offset to each other, each may have a substantially conical shape. According to FIG. 14, two conical drill holes 1402, 1404 are shown, which may overlap each other in an overlapping zone 1400, as may be obtained, for example, by laser drilling from mutually opposing main surfaces 110, 112 of the conductor board. An excellent suppression of the warpage may be achieved in particular with an only moderate offset of the two conical partial drill holes 1402, 1404, in particular when realizing the density conditions according to FIG. 16 and/or the distance conditions according to FIG. 17.

Figure 15:
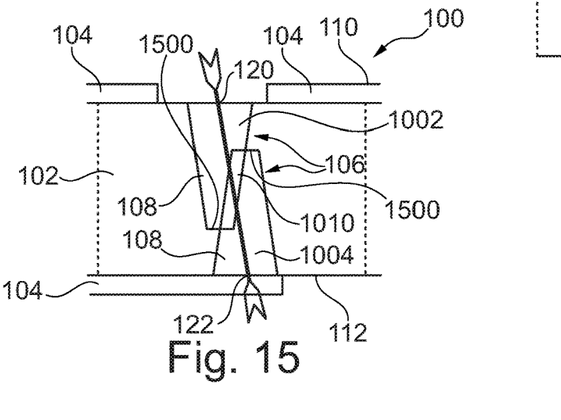

FIG. 15 shows a cross-sectional view of a conductor board 100 according to still another exemplary embodiment of the invention. According to FIG. 15, the two partial drill holes 1002, 1004 may be formed as frustums (or truncated cones), which may be laterally offset to each other. The degree of asymmetry according to FIG. 15 may be particularly high, because also step sections 1500 may be formed besides the overlapping zone 1010.

Figure 16:
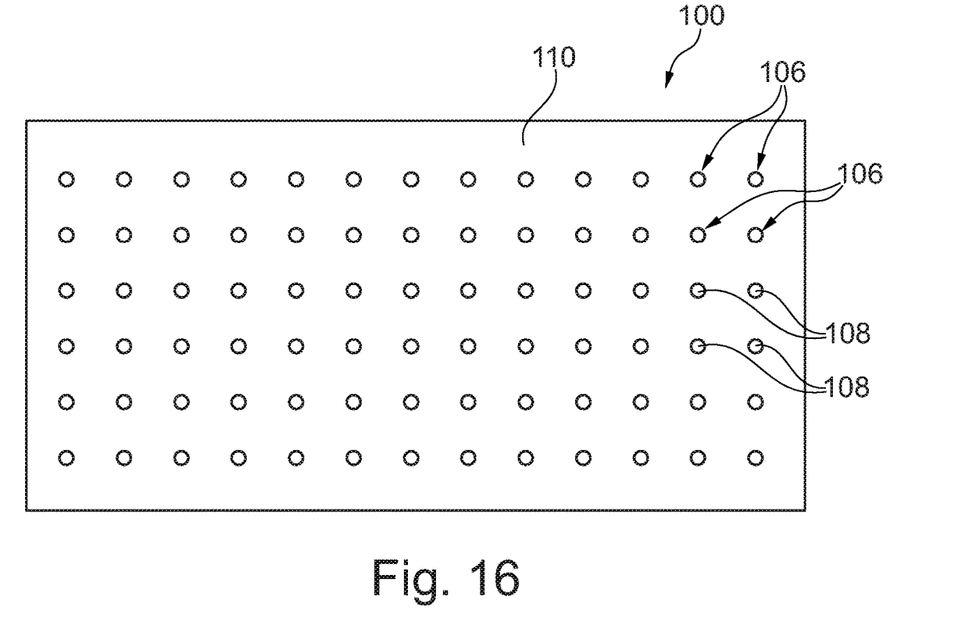
FIG. 16 shows a plan view of a conductor board according to an exemplary embodiment of the invention.

FIG. 16 shows a plan view of a conductor board 100 according to an exemplary embodiment of the invention, which may have a warpage stabilization structure 106 which may be formed as inclined through-crossing connections 108. The through-crossing connections 108 may be arranged in a matrix shape along lines and columns in the two mutually orthogonal directions of the paper plane of FIG. 16. According to FIG. 16, the density of the number of through-crossing connections 108 at the main surface 110 per area may amount to 250 pieces/mm². The through-crossing connections 108 may, according to FIG. 16, be arranged in a matrix shape, i.e. along lines and columns. However, according to different embodiment examples of the invention, also an irregular arrangement of the through-crossing connections 108 at the mutually opposing main surfaces 110, 112 may be implemented.

Figure 17:
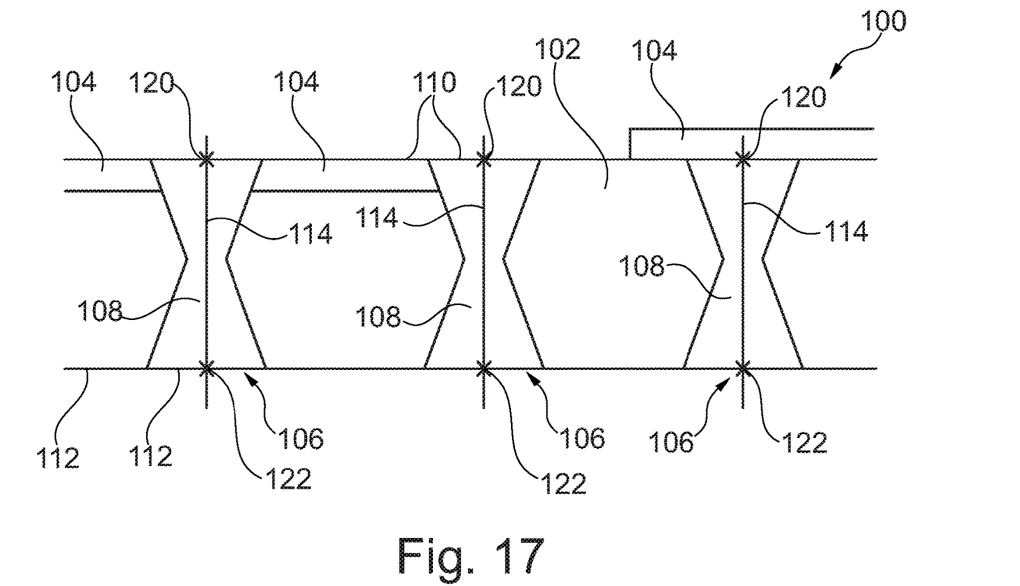

FIG. 17 shows a cross-sectional view of a conductor board 100 according to an exemplary embodiment of the invention, in which the through-crossing connections 108 may have been obtained in the form of partial drill holes, which may be connected with each other and which may be conical or frustoconical, by laser drilling at both opposing main surfaces 110, 112. According to FIG. 17, the resulting, sandglass-shaped structures may be formed heterogeneously among each other, i.e. they may have different shapes and main extension directions. An extremely good improvement of the warpage properties may be enabled in particular according to this embodiment.

According to FIG. 17, an average distance from hole center to hole center between neighboring through-crossing connections 108 at one of the main surfaces 110, 112 of the conductor board 100 may, for example, be in a range between 50 μm and 100 μm.

Even if the embodiment examples of the invention, which have been described with reference to the figures, may be related to conductor boards, all the aspects described for conductor boards may also be applied to substrates in a corresponding manner (with adapted dimensions, if applicable, refer to the description above), or to other component carrier devices.

Supplementarily, it should be noted that "having" or "comprising" does not exclude other elements or steps, and that "a" or "an" does not exclude a plurality. It should be noted in addition that features or steps, which have been described with reference to one of the embodiment examples above, may also be used in combination with other features or steps of other embodiment examples described above.

The invention claimed is:

1. A device for electrically connecting components, the device comprising:
   at least one electrically insulating layer structure;
   at least one electrically conducting layer structure, which is stacked and consolidated with the at least one electrically insulating layer structure under formation of a stack of layers;
   a warpage stabilization structure for stabilizing the device in a warpage-suppressing manner, which structure at least partially pervades at least two of the layer structures of the stack of layers,
   wherein the warpage stabilization structure is formed by at least one through-crossing connection, a main extension direction of which forms an acute angle with at least one main surface of the device, and
   wherein the acute angle is in a range between 70° and 89°, wherein the warpage stabilization structure is formed by a plurality of through-crossing connections comprising the at least one through-crossing connection, wherein at least a portion of different ones of the plurality of through-crossing connections are arranged with different values of the acute angle with respect to the at least one main surface, and thus are not parallel to each other,
   wherein the at least one through-crossing connection is formed by at least two drill holes, which drill holes are connected with each other, are formed asymmetrically to each other, are displaced laterally to each other, and are at least partially filled with material, wherein the at least two drill holes, which are offset laterally to each other, each have at least one of substantially a conical or frustoconical shape and substantially a circular cylindrical shape.

2. The device according to claim 1, wherein at least a portion of the at least one through-crossing connection is filled at least partially with an electrically conducting material,
   wherein the electrically conducting material of the at least one through-crossing connection adjoins directly to the at least one electrically insulating layer structure at least along a portion of the extension through the device of the at least one through-crossing connection, and/or
   wherein at least a portion of the at least one through-crossing connection is free of material.

3. The device according to claim 1, wherein the at least one through-crossing connection is integrated in the at least one electrically conducting layer structure and/or in the at least one electrically insulating layer structure with a mechanical pre-load, which counteracts a warpage force.

4. The device according to claim 1,
   wherein a material of the at least one electrically insulating layer structure has a greater value of the coefficient of thermal expansion than at least one of the group, which consists of: a material of the at least one electrically conducting layer structure, and a material of the at least one through-crossing connection, or
   wherein a material of the at least one electrically insulating layer structure has a smaller value of the coefficient of thermal expansion than at least one of the group, which consists of: a material of the at least one electrically conducting layer structure and a material of the at least one through-crossing connection.

5. The device according to claim 1, wherein at least a portion of the at least one through-crossing connection is formed as a through-contacting, which completely pervades the device in a stacking direction of the stack of layers, or as a contacting, which only precisely at least partially pervades the device in a stacking direction of the stack of layers.

6. The device according to claim 1, wherein at least one electronic component is embedded in the at least one electrically insulating layer structure and/or in the at least one electrically conducting layer structure, wherein the at least one electronic component is selected from a group, which consists of: an active electronic component, a passive electronic component, a data storage device, a filter device, an integrated circuit, a signal processing component, a power management component, an optical-electrical interface element, a voltage converter, a cryptographic component, a capacitance, a resistance, a transmission and/or receiving unit, an electromechanical transducer, an inductance, a switch, a micro-electromechanical system, a battery, a camera and an antenna.

7. The device according to claim 1,
wherein a number of through-crossing connections of the plurality of through-crossing connections per area of a main surface of the device is in a range between 50 mm$^{-2}$ and 1000 mm$^{-2}$, and/or
wherein a mean distance between neighboring through-crossing connections of the plurality of through-crossing connections at a main surface of the device is in a range between 30 μm and 200 μm.

8. The device according to claim 1, wherein the electrically insulating layer structure has a material from a group, which consists of: resin, bismaleimide-triazine resin, cyanate ester, glass, glass fibres, prepreg material, polyimide, a liquid crystal polymer, epoxide-based build-up film, FR4 material, a ceramic, and a metal oxide.

9. The device according to claim 1, wherein the at least one electrically conducting layer structure has copper.

10. The device according to claim 1, formed as a conductor board or as a substrate.

11. A device for electrically connecting components, the device comprising:
at least one electrically insulating layer structure;
at least one electrically conducting layer structure, which is stacked and consolidated with the at least one electrically insulating layer structure under formation of a stack of layers;
a warpage stabilization structure for stabilizing the device in a warpage-suppressing manner, which structure at least partially pervades at least two of the layer structures of the stack of layers,
wherein the warpage stabilization structure is formed by at least one through-crossing connection, a main extension direction of which forms an acute angle with at least one main surface of the device, and
wherein the acute angle is in a range between 70° and 89°,
wherein the warpage stabilization structure is formed by a plurality of through-crossing connections comprising the at least one through-crossing connection, wherein at least a portion of different ones of the plurality of through-crossing connections are arranged with different values of the acute angle with respect to the at least one main surface, and thus are not parallel to each other, wherein the at least one through-crossing connection is formed by at least two drill holes, which drill holes are connected with each other, are formed asymmetrically to each other, are displaced laterally to each other, and are at least partially filled with material, wherein the at least two drill holes, which are laterally offset to each other, are oriented perpendicular to at least one main surface of the device.

12. The device according to claim 11, wherein at least a portion of the at least one through-crossing connection is filled at least partially with an electrically conducting material,
wherein the electrically conducting material of the at least one through-crossing connection adjoins directly to the at least one electrically insulating layer structure at least along a portion of the extension through the device of the at least one through-crossing connection, and/or
wherein at least a portion of the at least one through-crossing connection is free of material.

13. The device according to claim 11, wherein the at least one through-crossing connection is integrated in the at least one electrically conducting layer structure and/or in the at least one electrically insulating layer structure with a mechanical pre-load, which counteracts a warpage force.

14. The device according to claim 11,
wherein a material of the at least one electrically insulating layer structure has a greater value of the coefficient of thermal expansion than at least one of the group, which consists of: a material of the at least one electrically conducting layer structure, and a material of the at least one through-crossing connection, or
wherein a material of the at least one electrically insulating layer structure has a smaller value of the coefficient of thermal expansion than at least one of the group, which consists of: a material of the at least one electrically conducting layer structure and a material of the at least one through-crossing connection.

15. A device for electrically connecting components, the device comprising:
at least one electrically insulating layer structure;
at least one electrically conducting layer structure, which is stacked and consolidated with the at least one electrically insulating layer structure under formation of a stack of layers;
a warpage stabilization structure for stabilizing the device in a warpage-suppressing manner, which structure at least partially pervades at least two of the layer structures of the stack of layers,
wherein the warpage stabilization structure is formed by at least one through-crossing connection, a main extension direction of which forms an acute angle with at least one main surface of the device, and
wherein the acute angle is in a range between 70° and 89°,
wherein the warpage stabilization structure is formed by a plurality of through-crossing connections comprising the at least one through-crossing connection,
wherein at least a portion of different ones of the plurality of through-crossing connections are arranged with different values of the acute angle with respect to the at least one main surface, and thus are not parallel to each other,
wherein the at least one through-crossing connection is formed by at least two drill holes, which drill holes are connected with each other, are formed asymmetrically to each other, are displaced laterally to each other, and are at least partially filled with material, wherein the at least two drill holes have a lateral offset to each other in a range between 0.5 μm and 50 μm.

16. The device according to claim 15, wherein at least a portion of the at least one through-crossing connection is filled at least partially with an electrically conducting material,
wherein the electrically conducting material of the at least one through-crossing connection adjoins directly to the at least one electrically insulating layer structure at least along a portion of the extension through the device of the at least one through-crossing connection, and/or
wherein at least a portion of the at least one through-crossing connection is free of material.

17. The device according to claim 15, wherein the at least one through-crossing connection is integrated in the at least one electrically conducting layer structure and/or in the at least one electrically insulating layer structure with a mechanical pre-load, which counteracts a warpage force.

18. The device according to claim 15,
wherein a material of the at least one electrically insulating layer structure has a greater value of the coefficient of thermal expansion than at least one of the group, which consists of: a material of the at least one electrically conducting layer structure, and a material of the at least one through-crossing connection, or
wherein a material of the at least one electrically insulating layer structure has a smaller value of the coefficient of thermal expansion than at least one of the group, which consists of: a material of the at least one electrically conducting layer structure and a material of the at least one through-crossing connection.

* * * * *